(12) United States Patent
Yen et al.

(10) Patent No.: US 9,854,719 B2
(45) Date of Patent: Dec. 26, 2017

(54) PATTERNED GROUND SHIELD

(71) Applicant: Realtek Semiconductor Corporation, Hsinchu (TW)

(72) Inventors: Hsiao-Tsung Yen, Hsinchu (TW); Cheng-Wei Luo, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/233,967

(22) Filed: Aug. 11, 2016

(65) Prior Publication Data

US 2017/0223877 A1    Aug. 3, 2017

(30) Foreign Application Priority Data

Jan. 28, 2016  (TW) .............................. 105102673 A (51) Int. Cl.
*H05K 9/00* (2006.01)
*H01F 27/36* (2006.01)
*H01L 23/552* (2006.01)

(52) U.S. Cl.
CPC ......... *H05K 9/0064* (2013.01); *H01F 27/362* (2013.01); *H01L 23/552* (2013.01)

(58) Field of Classification Search
CPC ........ H05K 9/0064; H05K 2201/09681; H01L 23/552; H01F 27/362
See application file for complete search history.

(56) References Cited

U.S. PATENT DOCUMENTS

| 6,184,478 B1 * | 2/2001 | Imano .................. H05K 1/0253 174/255 |
| 6,310,387 B1 | 10/2001 | Seefeldt et al. |
| 6,452,249 B1 * | 9/2002 | Maeda ............. H01L 21/28518 257/347 |
| 8,426,750 B2 * | 4/2013 | Lee ...................... H05K 9/0003 174/377 |
| 8,659,126 B2 | 2/2014 | Lin et al. |
| 2003/0224681 A1 * | 12/2003 | Koch ........................ G21F 3/02 442/131 |
| 2005/0016746 A1 * | 1/2005 | Sze ...................... H05K 1/0227 174/396 |
| 2013/0056257 A1 * | 3/2013 | Chua .................... H05K 9/0088 174/388 |

\* cited by examiner

*Primary Examiner* — Hung V Ngo
(74) *Attorney, Agent, or Firm* — CKC Partners Co., Ltd.

(57) ABSTRACT

A patterned ground shield includes a plurality of portions, a first connection member, a second connection member, and a third connection member. Each of the first connection member and the second connection member is coupled to any of two of the portions which are not adjacent to each other. The third connection member is coupled to two of the portions which are adjacent to each other.

19 Claims, 10 Drawing Sheets

PATTERNED GROUND SHIELD

RELATED APPLICATIONS

This application claims priority to Taiwan Application Ser. No. 105102673, filed Jan. 28, 2016, which is herein incorporated by reference.

BACKGROUND

Field of Invention

The present disclosure relates to basic electronic elements. More particularly, the present disclosure relates to a patterned ground shield.

Description of Related Art

With advances in technology, manufacturing processes of integrated inductors are developing toward 28 nm and 20 nm. Such extremely small dimensions of integrated inductors, however, are the cause of a number of negative effects. For example, the capacitance thereof is high since the oxide layer of the integrated inductor is thin, the capacitance among redistribution layers (RIX) is high since the RDLs employed in the integrated inductor is thick, and so on. Such situations affect the quality factor of inductors.

In view of the foregoing, problems and disadvantages are associated with existing products that require further improvement. However, those skilled in the art have yet to find a solution.

SUMMARY

One aspect of the present disclosure is directed to a patterned ground shield. The patterned ground shield comprises a plurality of portions, a first connection member, a second connection member, and a third connection member. Each of the first connection member and the second connection member is coupled to any of two of the portions which are not adjacent to each other. The third connection member is coupled to two of the portions which are adjacent to each other.

Another aspect of the present disclosure is directed to a ground shield. The ground shield comprises a first portion to an eighth portion, and a first connection member to a fourth connection member. The first connection member is coupled to the first portion, the fourth portion and the seventh portion. The second connection member is coupled to the second portion, the fifth portion and the seventh portion. The third connection member is coupled to the third portion, the fifth portion and the eighth portion. The fourth connection member is coupled to the first portion, the third portion and the sixth portion. The first portion to the eighth portion are disposed around the first connection member to the fourth connection member in sequential order.

In view of the foregoing, embodiments of the present disclosure provide a patterned ground shield layer for improving the quality factor of an inductor in an integrated inductor and enhance the performance of the integrated inductor.

BRIEF DESCRIPTION OF THE DRAWINGS

The disclosure can be more fully understood by reading the following detailed description of the embodiments, with reference made to the accompanying drawings as follows.

DETAILED DESCRIPTION

The detailed description provided below in connection with the appended drawings is intended as a description of the present examples and is not intended to represent the only forms, in which the present examples may be constructed or utilized. The description sets forth the functions of the examples and the sequence of steps for constructing and operating the examples. However, the same or equivalent functions and sequences may be accomplished by different examples.

Figure 1:
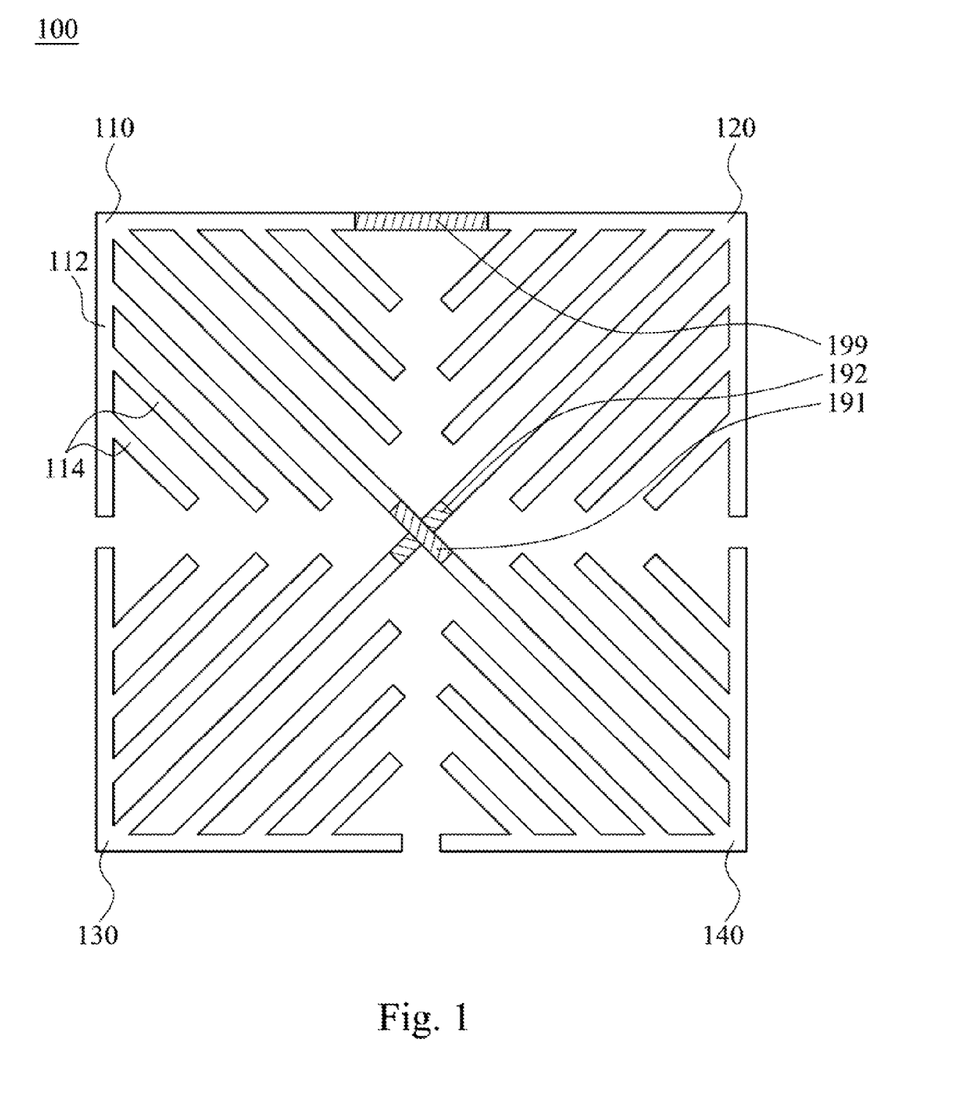
FIG. 1 is a schematic diagram of a patterned ground shield according to embodiments of the present disclosure.

FIG. 1 is a schematic diagram of a patterned ground shield according to embodiments of the present disclosure. As shown in the figure, the patterned ground shield layer (patterned ground shield) 100 comprises a plurality of portions (e.g., a first portion 110, a second portion 120, a third portion 130 and a fourth portion 140), a first connection member 191, a second connection member 192 and a third connection member 199. With respect to the connection structure of these elements, each of the first connection member 191 and the second connection member 192 is coupled to any of two of the portions which are not adjacent to each other. For instance, the first connection member 191 is coupled to the first portion 110 and the fourth portion 140 which are not adjacent to each other. In addition the second connection member 192 is coupled to the second portion 120 and the third portion 130 which are not adjacent to each other. Moreover, the third connection member 199 is coupled to two of the portions which are adjacent to each other. For instance, the third connection member 199 is coupled to the first portion 110 and the second portion 120 which are adjacent to each other. However, the present disclosure is not limited to the embodiment as shown in FIG. 1, and the third connection member 199 can be coupled to the second portion 120 and the fourth portion 140 which are adjacent to each other, the third connection member 199 can be coupled to the third portion 130 and the fourth portion 140 which are adjacent to each other, or the third connection member 199 can be coupled to the first portion 110 and the third portion 130 which are adjacent to each other, depending on actual requirements.

Among the portions 110-140 of the patterned ground shield layer 100, each of the connection members 191, 192 is coupled to any of two of the portions which are not adjacent to each other, and the third connection member 199 is coupled to the portions which are adjacent to each other. Hence, if the patterned ground shield layer 100 is disposed inside an integrated inductor (i.e., disposed between an inductor and a substrate of the integrated inductor), the patterned ground shield layer 100 can not only prevent the inductor inside the integrated inductor form generating current on the substrate inside the integrated inductor to thereby affect the quality of the inductor, but also can make the current hard to flow on the patterned ground shield layer 100 due to its special disposition for avoiding coupling generated among therein, such that the quality of the inductor can be enhanced.

Figure 2:
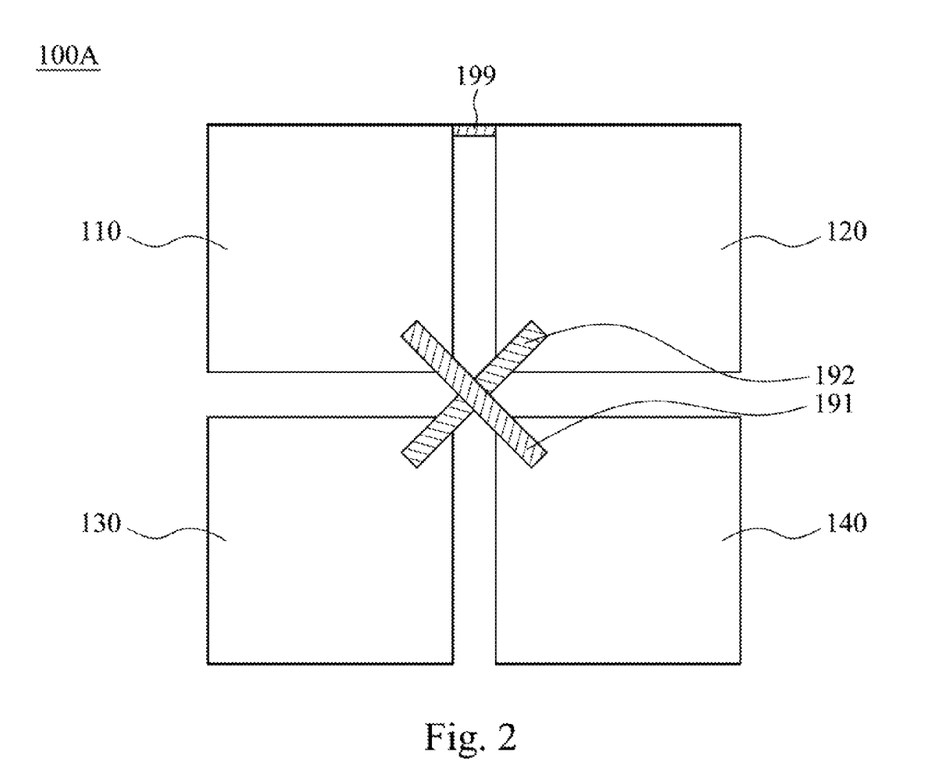
FIG. 2 is a schematic diagram of a patterned ground shield according to embodiments of the present disclosure.

FIG. 2 is a schematic diagram of a patterned ground shield according to embodiments of the present disclosure. For facilitating the understanding of the disposition and the connection of the patterned ground shield layer 100 in FIG. 1, the portions 110-140 of FIG. 1 are represented by blocks. The patterned ground shield layer 100A comprises a first portion 110, a second portion 120, a third portion 130 and a fourth portion 140. With respect to the disposition of these elements, the second portion 120 is adjacent to the first portion 110, the third portion 130 is adjacent to the first portion 110, and the fourth portion 140 is adjacent to the second portion 120 and the third portion 130. With respect to the connection structure of these elements, the first connection member 191 is coupled to the first portion 110 and the fourth portion 140. Moreover, the second connection member 192 is coupled to the second portion 120 and the third portion 130. In this embodiment, the patterned ground shield layer 100A also comprises a third connection member 199. The third connection member 199 is coupled to two of the portions which are adjacent to each other. For example, the third connection member 199 is coupled to the first portion 110 and the second portion 120, coupled to the first portion 110 and third portion 130, coupled to the third portion 130 and the fourth portion 140, or coupled to the second portion 120 and the fourth portion 140, depending on the actual requirements.

Figure 3:
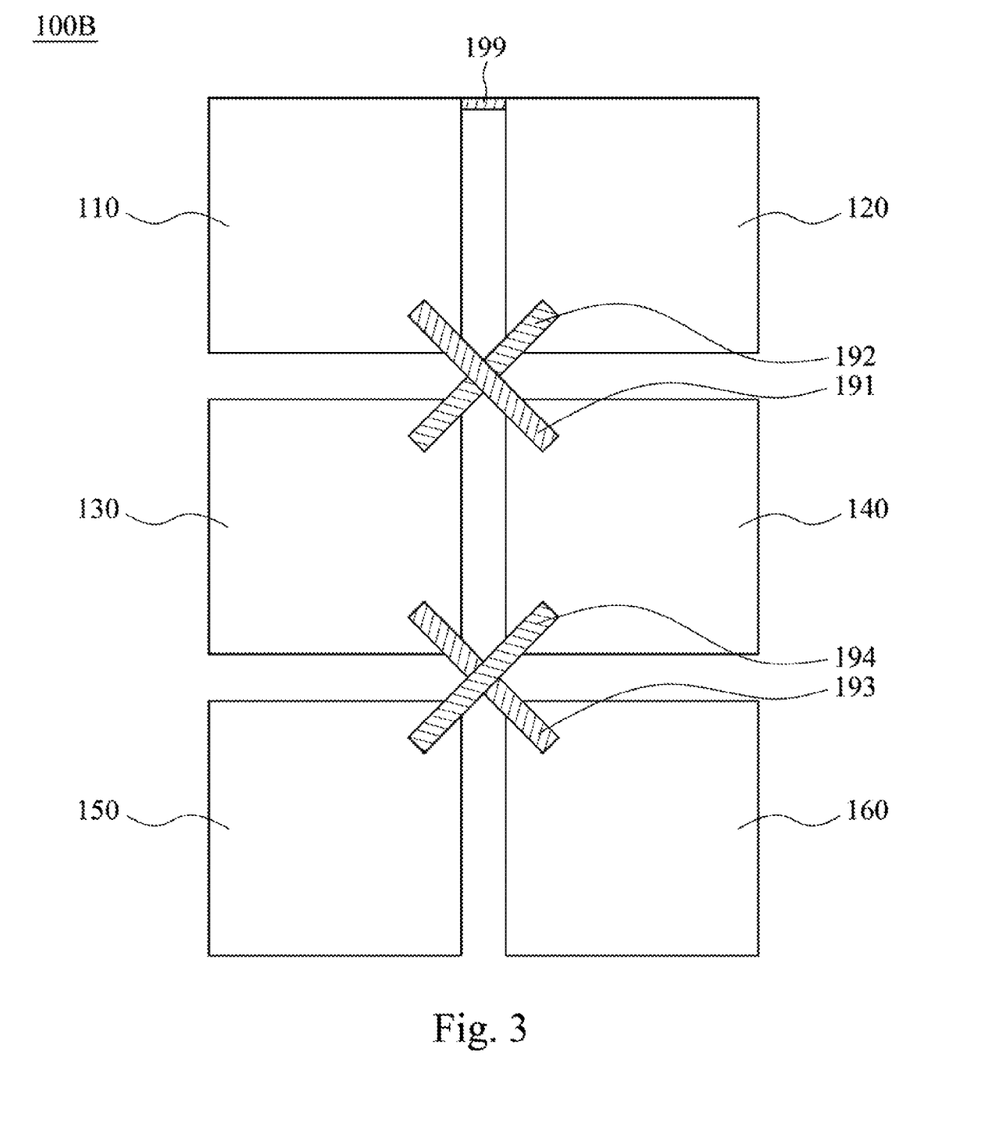
FIG. 3 is a schematic diagram of a patterned ground shield according to embodiments of the present disclosure.

FIG. 3 is a schematic diagram of a patterned ground shield according to embodiments of the present disclosure. Compared with the patterned ground shield layer 100A as shown in FIG. 2, the patterned ground shield layer 100B as shown in FIG. 3 further comprises a fifth portion 150, a sixth portion 160, a fourth connection member 193 and a fifth connection member 194. With respect to the disposition of these elements, the fifth portion 150 is adjacent to the third portion 130, and the sixth portion 160 is adjacent to the fourth portion 140 and the fifth portion 150. With respect to the connection structure of these elements, the fourth connection member 193 is coupled to the third portion 130 and the sixth portion 160, and the fifth connection member 194 is coupled to the fourth portion 140 and the fifth portion 150. In some embodiments, the first connection member 191 is disposed above the second connection member 192, and the fifth connection member 194 is disposed above the fourth connection member 193. In some embodiments, the patterned ground shield layer 100B also comprises the third connection member 199. The third connection member 199 is coupled to two of the portions which are adjacent to each other. For example, the third connection member 199 is coupled to the first portion 110 and the second portion 120, coupled to the third portion 130 and the fourth portion 140, or coupled to the fifth portion 150 and the sixth portion 160, depending on actual requirements.

Figure 4:
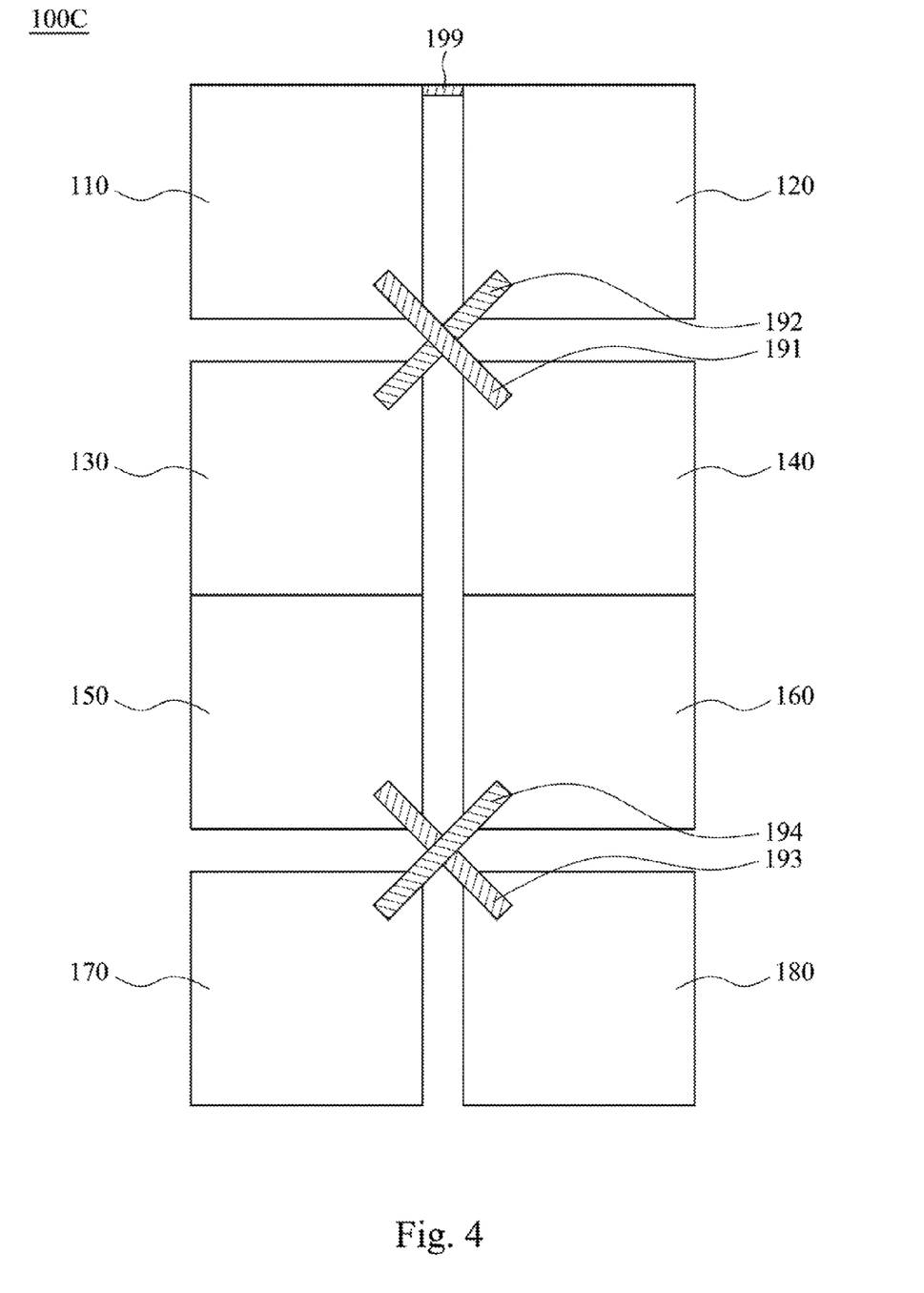
FIG. 4 is a schematic diagram of a patterned ground shield according to embodiments of the present disclosure.

FIG. 4 is a schematic diagram of a patterned ground shield according to embodiments of the present disclosure. Compared with the patterned ground shield layer 100A as shown in FIG. 2, the patterned ground shield layer 100C as shown in FIG. 4 further comprises a fifth portion 150, a sixth portion 160, a seventh portion 170, an eighth portion 180, a fourth connection member 193 and a fifth connection member 194. With respect to the disposition of these elements, the fifth portion 150 is coupled to the third portion 130, the sixth portion 160 is coupled to the fourth portion 140, the seventh portion 170 is adjacent to the fifth portion 150, and the eighth portion 180 is adjacent to the sixth portion 160 and the seventh portion 170. With respect to the connection structure of these elements, the fourth connection member 193 is coupled to the fifth portion 150 and the eighth portion 180, and the fifth connection member 194 is coupled to the sixth portion 160 and the seventh portion 170. In some embodiments, the first connection member 191 is disposed above the second connection member 192, and the fifth connection member 194 is disposed above the fourth connection member 193.

Figure 5:
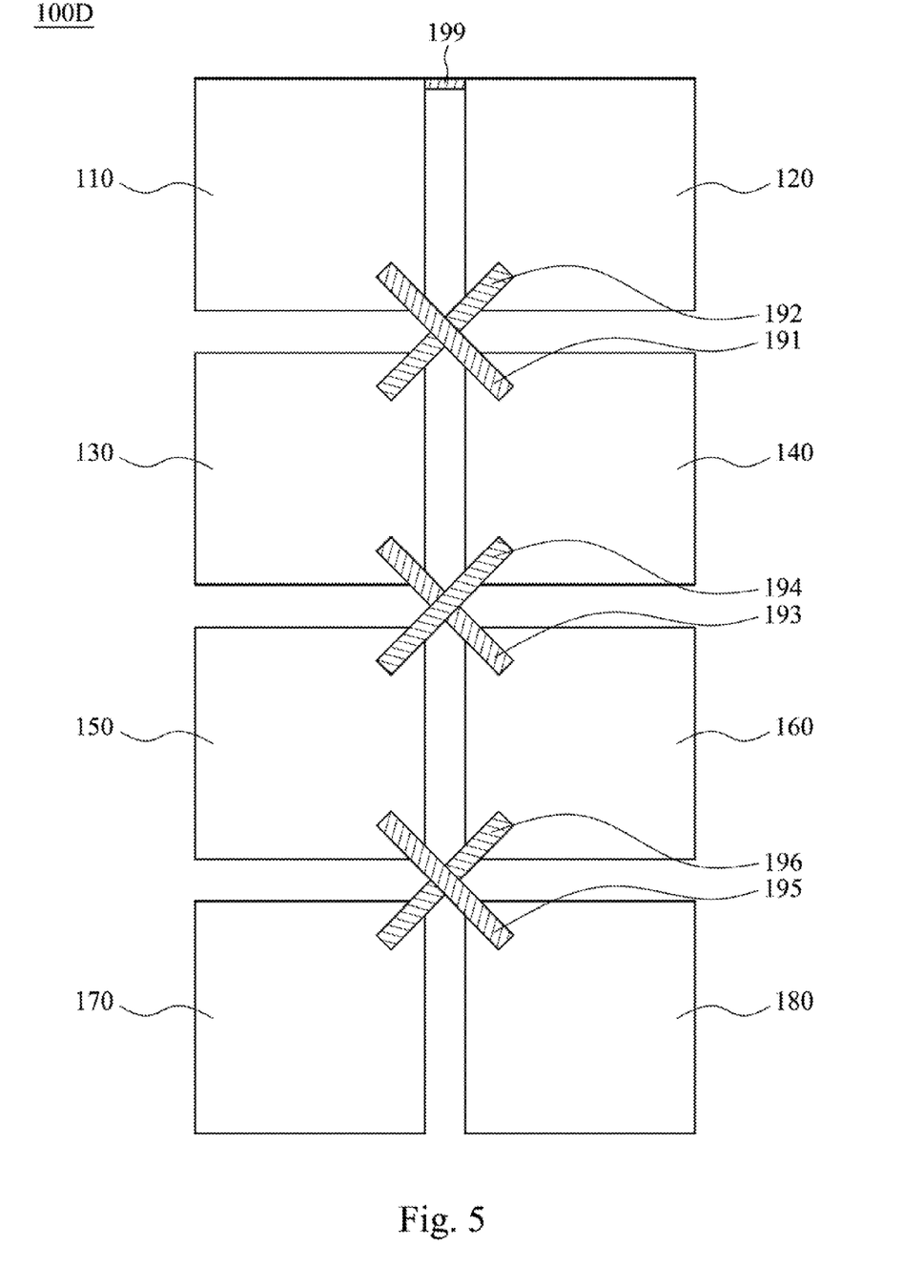
FIG. 5 is a schematic diagram of a patterned ground shield according to embodiments of the present disclosure.

FIG. 5 is a schematic diagram of a patterned ground shield according to embodiments of the present disclosure. Compared with the patterned ground shield layer 100A as shown in FIG. 2, the patterned ground shield layer 100D as shown in FIG. 5 further comprises a fifth portion 150, a sixth portion 160, a seventh portion 170, an eighth portion 180, a fourth connection member 193, a fifth connection member 194, a sixth connection member 195 and a seventh connection member 196. With respect to the disposition of these elements, the fifth portion 150 is adjacent to the third portion 130, the sixth portion 160 is adjacent to the fourth portion 140 and the fifth portion 150, the seventh portion 170 is adjacent to the fifth portion 150, the eighth portion 180 is adjacent to the sixth portion 160 and the seventh portion 170. With respect to the connection structure of these elements, the fourth connection member 193 is coupled to the third portion 130 and the sixth portion 160, the fifth connection member 194 is coupled to the fourth portion 140 and the fifth portion 150, the sixth connection member 195 is coupled to the fifth portion 150 and the eighth portion 180, the seventh connection member 196 is coupled to the sixth portion 160 and the seventh portion 170. In some embodiments, the first connection member 191 is disposed above the second connection member 192, the fifth connection member 194 is disposed above the fourth connection member 193, and the sixth connection member 195 is disposed above the seventh connection member 196.

Reference is made to both of FIG. 4 and FIG. 5. In some embodiments, the patterned ground shield layers 100C, 100D also comprise a third connection member 199. The third connection member 199 is coupled to two of the portions which are adjacent to each other. For example, the third connection member 199 is coupled to the first portion 110 and the second portion 120, coupled to the first portion 110 and the third portion 130, coupled to the third portion 130 and the fourth portion 140, coupled to the fifth portion 150 and the sixth portion 160, or coupled to the seventh portion 170 and the eighth portion 180, depending on actual requirements.

In the above-mentioned embodiments, the connection members 191-196 do not couple to each other. In addition, each of the portions 110-180 in the patterned ground shield layers 100 and 100A-100D comprises an outer frame and a plurality of metal portions. The metal portions are coupled to the outer frame. For facilitating understanding of these technical features, reference is now made to FIG. 1. The first portion 110 of the patterned ground shield layer 100 comprises an outer frame 112 and a plurality of metal portions 114, and the metal portions 114 are coupled to the outer frame 112. The remaining portions (i.e., the portions 120-140) of the patterned ground shield layer 100 are similar to the first portion 110, and detailed descriptions thereof are omitted herein. In some embodiments, every two of the portions which are coupled to each other are symmetrically disposed with respect to a center of the connection members. For instance, the first portion 110 and the fourth portion 140 which are coupled to each other are symmetrically disposed with respect to a center of the connection members 191, 192, and the second portion 120 and the third portion 130 which are coupled to each other are symmetrically disposed with respect to a center of the connection members 191, 192. In some embodiments, any portions which are adjacent to each other are symmetrically disposed. For instance, the first portion 110 and the second portion 120 which are adjacent to each other are symmetrically disposed, the first portion 110 and the third portion 130 which are adjacent to each other are symmetrically disposed, and so on. It is noted that although the patterned ground shield layer 100 of FIG. 1 is used herein for explanation, the technical feature of every two of the portions which are coupled to each other being symmetrically disposed with respect to a center of the connection members and the technical feature of any portions which are adjacent to each other being symmetrically disposed are also present in the patterned ground shield layers 100A-100D as shown in FIG. 2-FIG. 5, and detailed descriptions thereof are omitted herein.

Figure 6:
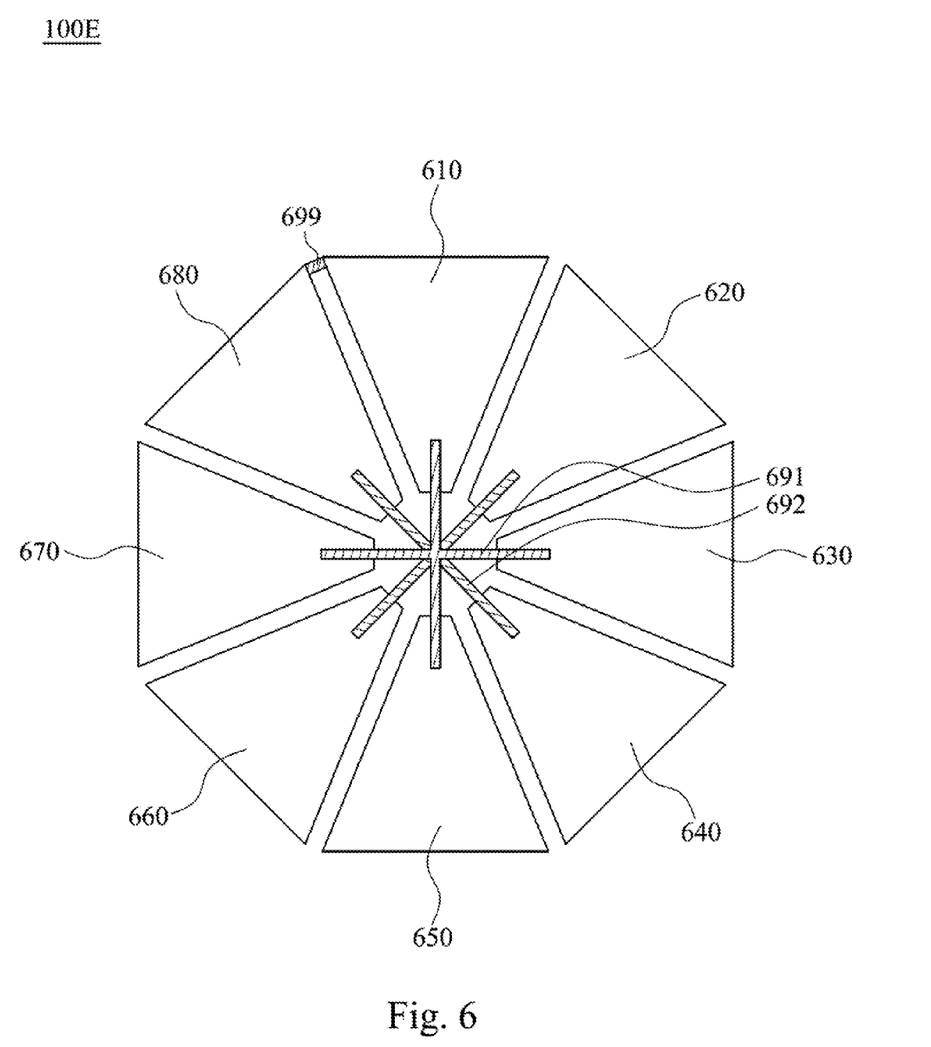
FIG. 6 is a schematic diagram of a patterned ground shield according to embodiments of the present disclosure.

FIG. 6 is a schematic diagram of a patterned ground shield according to embodiments of the present disclosure. As shown in the figure, the patterned ground shield layer 100E comprises a first portion 610 to an eighth portion 680. With respect to the disposition of these elements, the first portion 610 to the eighth portion 680 are disposed around connection members 691, 692 in sequential order. With respect to the connection structure of these elements, the first connection member 691 is coupled to the odd indexed portions, and the second connection member 692 is coupled to the even indexed portions. For instance, the first connection member 691 is coupled to the first portion 610, the third portion 630, the fifth portion 650 and the seventh portion 670. The second connection member 692 is coupled to the second portion 620, the fourth portion 640, the sixth portion 660 and the eighth portion 680. In some embodiments, the patterned ground shield layer 100E further comprises a third connection member 699. The third connection member 699 is coupled to one of the odd indexed portions and one of the even indexed portions. For instance, the third connection member 699 is coupled to the first portion 610 and the eighth portion 680.

Figure 7:
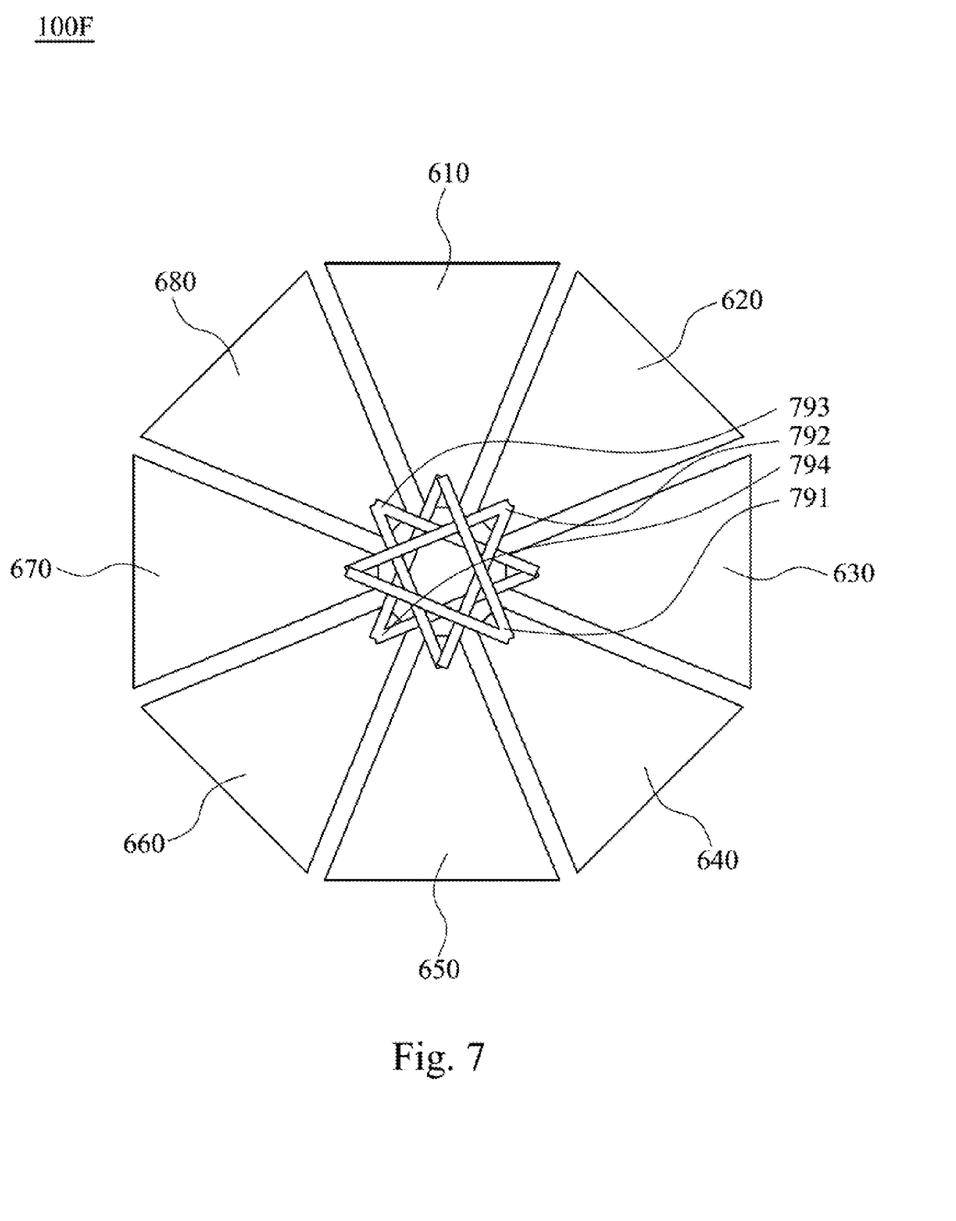
FIG. 7 is a schematic diagram of a patterned ground shield according to embodiments of the present disclosure.
Figure 8:
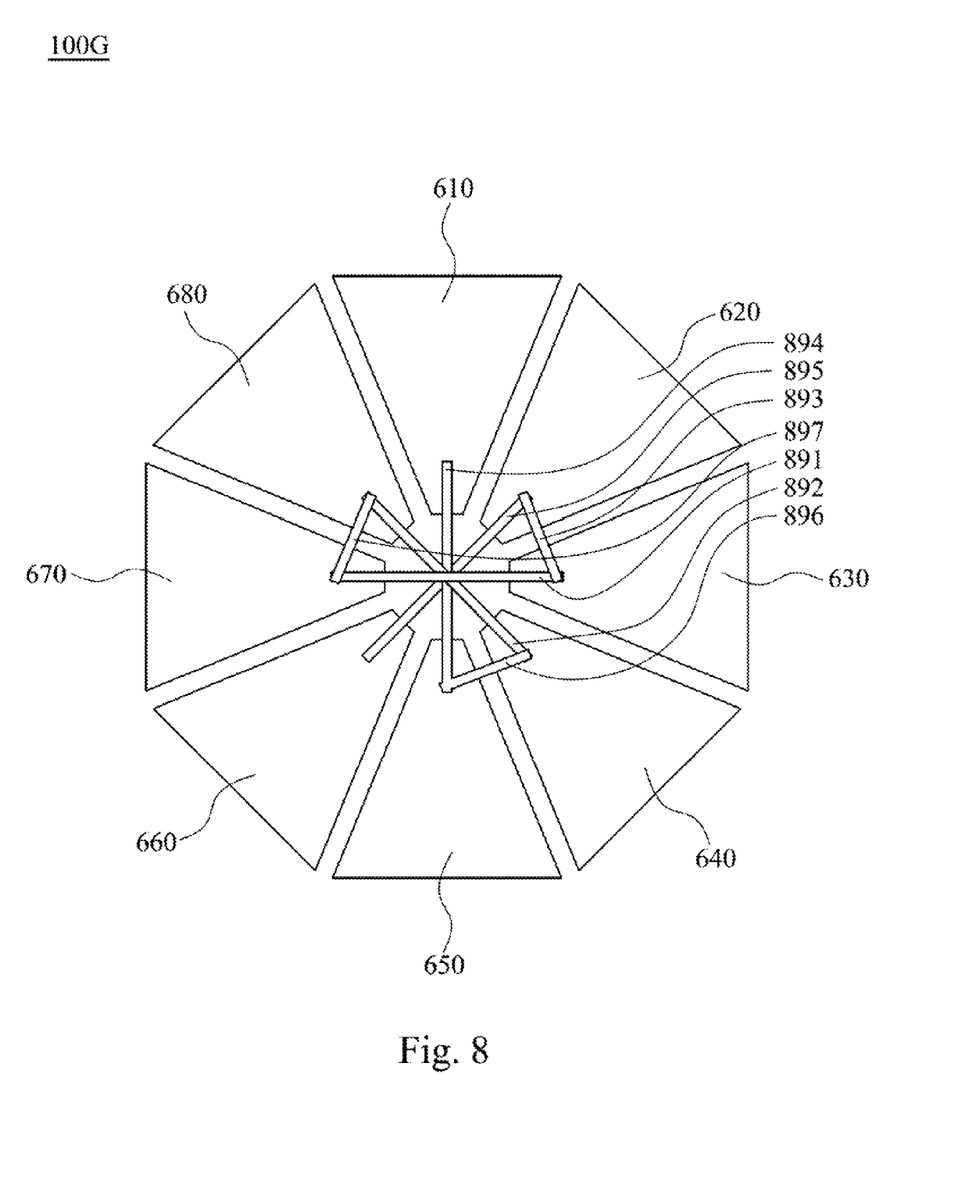
FIG. 8 is a schematic diagram of a patterned ground shield according to embodiments of the present disclosure.

FIG. 7 is a schematic diagram of a patterned ground shield according to embodiments of the present disclosure. Compared with the patterned ground shield layer 100E as shown in FIG. 6, the connection of the connection members of the patterned ground shield layer 100F as shown in FIG. 7 is different, which is described below. Referring to FIG. 7, the first connection member 791 is coupled to the first portion 610, the fourth portion 640 and the seventh portion 670, the second connection member 792 is coupled to the seventh portion 670, the second portion 620 and the fifth portion 650, the third connection member 793 is coupled to the fifth portion 650, the eighth portion 680 and the third portion 630, and the fourth connection member 794 is coupled to the third portion 630, the sixth portion 660 and the first portion 610. In some embodiments, the first connection member 791 is disposed above the second connection member 792, the second connection member 792 is disposed above the third connection member 793, and the third connection member 793 id disposed above the fourth connection member 794, FIG. 8 is a schematic diagram of a patterned ground shield according to embodiments of the present disclosure. Compared with the patterned ground shield layer 100E as shown in FIG. 6, the connection of the connection members of the patterned ground shield layer 100G in FIG. 8 is different, which is described below. Referring to FIG. 8, the first connection member 891 is coupled to the third portion 630 and the seventh portion 670, the second connection member 892 is coupled to the fourth portion 640 and the eighth portion 680, the third connection member 893 is coupled to the second portion 620 and the third portion 630, the fourth connection member 894 is coupled to the first portion 610 and the fifth portion 650, and the fifth connection member 895 is coupled to the second portion 620 and the sixth portion 660. In some embodiments, the patterned ground shield layer 100E further comprises a sixth connection member 896 and a seventh connection member 897. The sixth connection member 896 is coupled to the fourth portion 640 and the fifth portion 650, and the seventh connection member 897 is coupled to the seventh portion 670 and the eighth portion 680. In some embodiments, the first connection member 891 is disposed above the second connection member 892; the second connection member 892 is disposed above the fourth connection member 894, and the fourth connection member 894 is disposed above the fifth connection member 895. In addition, the third connection member 893, the sixth connection member 896 and the seventh connection member 897 are disposed at the same layer. In some embodiments, the third connection member 893, the sixth connection member 896, the seventh connection member 897, and the fourth connection member 894 can be disposed at the same layer.

Figure 9:
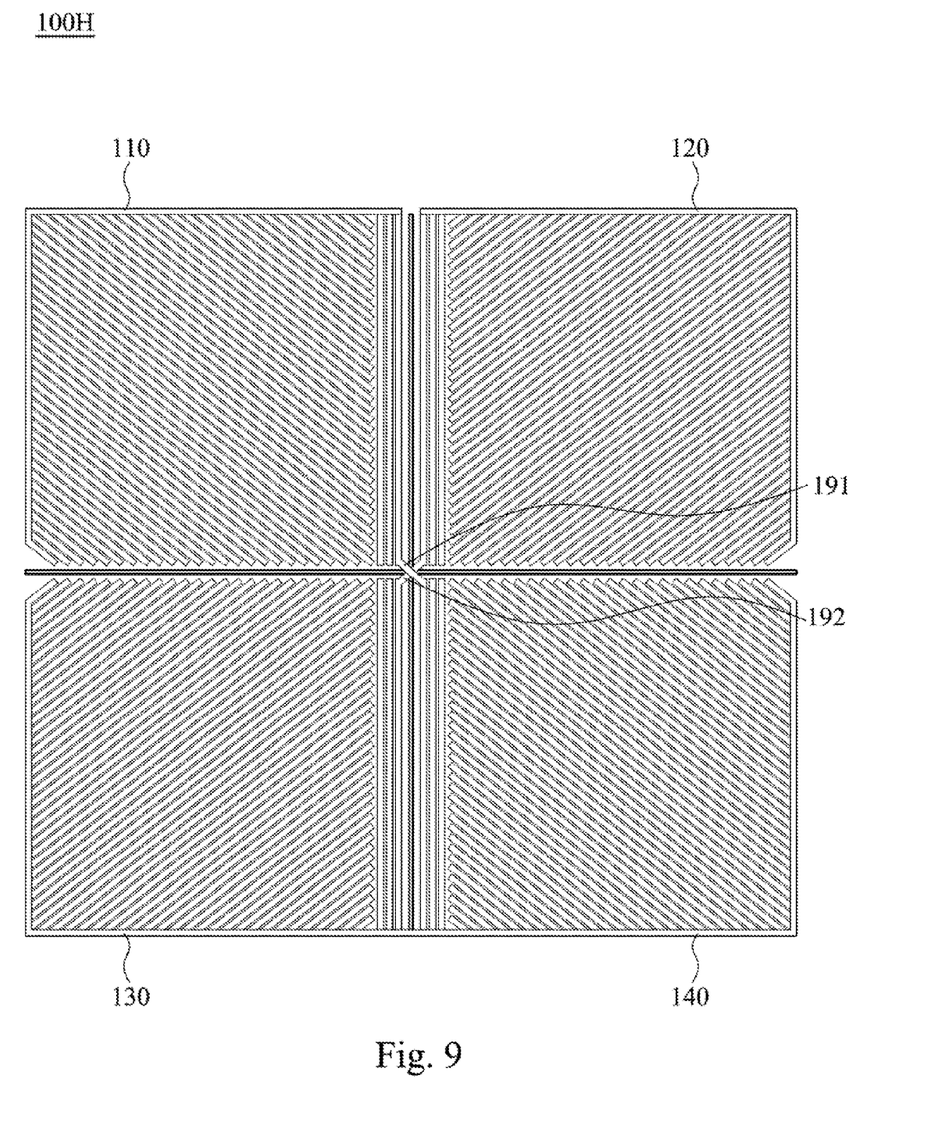
FIG. 9 is a schematic diagram of a patterned ground shield according to embodiments of the present disclosure.

FIG. 9 is a schematic diagram of a patterned ground shield according to embodiments of the present disclosure. Reference is now made to FIG. 1 The portions 110-140 of the patterned ground shield layer 100 comprise bar portions. The bar portions are disposed in an oblique direction in connection to the frame of the patterned ground shield layer 100. Compared with FIG. 1, the bar portions disposed between the connection area of the first portion 110 and the second portion 120 in the patterned ground shield layer 100H of FIG. 9 are disposed in a straight direction, and the bar portions disposed between the connection area of the third portion 130 and the fourth portion 140 are also disposed in a straight direction. In some embodiments, the number of the bar portions disposed in a straight direction can be one or plural.

Figure 10:
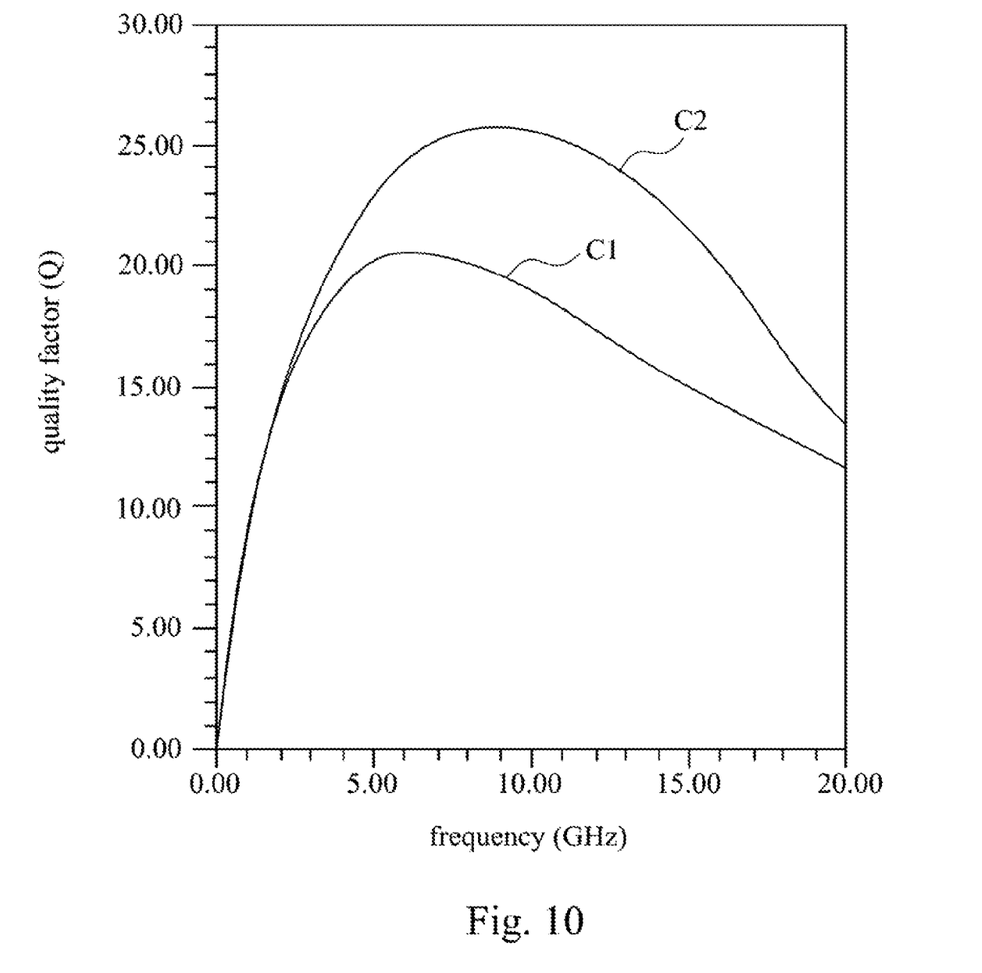
FIG. 10 is an experimental data diagram of an integrated inductor structure according to embodiments of the present disclosure.

FIG. 10 is an experimental data diagram of an integrated inductor according to embodiments of the present disclosure. This experimental data diagram is used for describing the quality factor a of an inductor of the integrated inductor when the inductor operates in different frequencies. In FIG. 10, the curve C1 represents experimental data if the patterned ground shield layer is not used in the integrated inductor of embodiments of the present disclosure. The curve C2 represents experimental data if the patterned ground shield layer is used in the integrated inductor of embodiments of the present disclosure. In this embodiment, the patterned ground shield layer of the present disclosure is disposed between the inductor and the substrate of the integrated inductor. As can be seen in the experimental data of FIG. 10, the quality factor of the curve C2 is better than that of the curve C1 Therefore, the diagram shows that the integrated inductor adopting the patterned ground shield layer of the present disclosure indeed can improve the quality factor of the inductor inside the integrated inductor. According to the experimental data, the quality factor of the inductor is enhanced by about 20%, thereby increasing the performance of the integrated inductor.

In view of the above embodiments of the present disclosure, it is apparent that the application of the present disclosure has a number of advantages. In particular, embodiments of the present disclosure provide a patterned ground shield layer for improving the quality factor of an inductor in an integrated inductor and enhance the performance of the integrated inductor.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A patterned ground shield, comprising:
    a plurality of portions;
    a first connection member and a second connection member, wherein each of the first connection member and the second connection member is coupled to any two of the portions which are not adjacent to each other; and
    a third connection member coupled to two of the portions which are adjacent to each other, wherein the connection members do not directly couple to each other.

2. The patterned ground shield of claim 1, wherein the portions comprise:
    a first portion;
    a second portion adjacent to the first portion;
    a third portion adjacent to the first portion; and
    a fourth portion adjacent to the second portion and the third portion;
    wherein the first connection member is coupled to the first portion and the fourth portion, and the second connection member is coupled to the second portion and the third portion.

3. The patterned ground shield of claim 2, wherein the portions further comprise:
    a fifth portion adjacent to the third portion; and
    a sixth portion adjacent to the fourth portion and the fifth portion;
    wherein the patterned ground shield further comprises:
    a fourth connection member coupled to the third portion and the sixth portion; and
    a fifth connection member coupled to the fourth portion and the fifth portion.

4. The patterned ground shield of claim 3, wherein the first connection member is disposed above the second connection member, and the fifth connection member is disposed above the fourth connection member.

5. The patterned ground shield of claim 2, wherein the portions further comprise:
    a fifth portion coupled to the third portion;
    a sixth portion coupled to the fourth portion;
    a seventh portion adjacent to the fifth portion; and
    an eighth portion adjacent to the sixth portion and the seventh portion;
    wherein the patterned ground shield further comprises:
    a fourth connection member coupled to the fifth portion and the eighth portion; and
    a fifth connection member coupled to the sixth portion and the seventh portion.

6. The patterned ground shield of claim 5, wherein the first connection member is disposed above the second connection member, and the fifth connection member is disposed above the fourth connection member.

7. The patterned ground shield of claim 2, wherein the portions further comprise:
    a fifth portion adjacent to the third portion;
    a sixth portion adjacent to the fourth portion and the fifth portion;
    a seventh portion adjacent to the fifth portion; and
    an eighth portion adjacent to the sixth portion and the seventh portion;
    wherein the patterned ground shield further comprises:
    a fourth connection member coupled to the third portion and the sixth portion;
    a fifth connection member coupled to the fourth portion and the fifth portion;
    a sixth connection member coupled to the fifth portion and the eighth portion; and
    a seventh connection member coupled to the sixth portion and the seventh portion.

8. The patterned ground shield of claim 7, wherein the first connection member is disposed above the second connection member, the fifth connection member is disposed above the fourth connection member, and the sixth connection member is disposed above the seventh connection member.

9. The patterned ground shield of claim 1, wherein each of the portions comprises:
    an outer frame; and
    a plurality of metal portions coupled to the outer frame.

10. The patterned ground shield of claim 9, wherein every two of the portions which are coupled to each other are symmetrically disposed with respect to a center of the connection members.

11. The patterned ground shield of claim 9, wherein any portions which are adjacent to each other are symmetrically disposed.

12. The patterned ground shield of claim 1, wherein the portions comprise:
    a first portion to an eighth portion disposed around the first connection member and the second connection member in sequential order;
    wherein the first connection member is coupled to the portions with an odd index among the first portion to the eighth portion, and the second connection member coupled to the portions with an even index among the first portion to the eighth portion.

13. The patterned ground shield of claim 12, wherein the third connection member is coupled to one of the portions with an odd index and one of the portions with an even index.

14. The patterned ground shield of claim 1, wherein the portions comprise:
    a first portion to an eighth portion disposed around the first connection member and the second connection member in sequential order;
    wherein the first connection member is coupled to the third portion and the seventh portion, the second connection member is coupled to the fourth portion and the eighth portion, and the third connection member is coupled to the second portion and the third portion,
    wherein the patterned ground shield further comprises:
    a fourth connection member coupled to the first portion and the fifth portion; and a fifth connection member coupled to the second portion and the sixth portion.

15. The patterned ground shield of claim 14, further comprising:
a sixth connection member coupled to the fourth portion and the fifth portion; and
a seventh connection member coupled to the seventh portion and the eighth portion.

16. The patterned ground shield of claim 15, wherein the first connection member is disposed above the second connection member, the second connection member is disposed above the fourth connection member, and the fourth connection member is disposed above the fifth connection member.

17. The patterned ground shield of claim 16, wherein the third connection member, the sixth connection member and the seventh connection member are located at the same layer.

18. A ground shield, comprising:
a first portion to an eighth portion;
a first connection member coupled to the first portion, the fourth portion and the seventh portion;
a second connection member coupled to the second portion, the fifth portion and the seventh portion;
a third connection member coupled to the third portion, the fifth portion and the eighth portion; and
a fourth connection member coupled to the first portion, the third portion and the sixth portion, wherein the first portion to the eighth portion are disposed around the first connection member to the fourth connection member in sequential order.

19. The ground shield of claim 18, wherein the first connection member is disposed above the second connection member, the second connection member is disposed above the third connection member, and the third connection member is disposed above the fourth connection member.

* * * * *